United States Patent
Maarbjerg et al.

(10) Patent No.: US 11,955,607 B2
(45) Date of Patent: Apr. 9, 2024

(54) MONITORING SYSTEM FOR AN ENERGY STORAGE

(71) Applicant: KK Wind Solutions A/S, Ikast (DK)

(72) Inventors: Anders Eggert Maarbjerg, Ulstrup (DK); Lóránd Bede, Herning (DK)

(73) Assignee: KK WIND SOLUTIONS A/S, Ikast (DK)

(*) Notice: Subject to any disclaimer, the term of this patent is extended or adjusted under 35 U.S.C. 154(b) by 138 days.

(21) Appl. No.: 17/757,738

(22) PCT Filed: Dec. 17, 2020

(86) PCT No.: PCT/DK2020/050376
§ 371 (c)(1),
(2) Date: Jun. 20, 2022

(87) PCT Pub. No.: WO2021/129912
PCT Pub. Date: Jul. 1, 2021

(65) Prior Publication Data
US 2023/0223604 A1 Jul. 13, 2023

(30) Foreign Application Priority Data

Dec. 23, 2019 (DK) .......................... PA 2019 70832

(51) Int. Cl.
*H01M 10/48* (2006.01)
*H01M 10/42* (2006.01)
(Continued)

(52) U.S. Cl.
CPC ....... *H01M 10/425* (2013.01); *H01M 10/482* (2013.01); *H01M 50/51* (2021.01);
(Continued)

(58) Field of Classification Search
CPC .................. G01R 31/36; G01R 31/364; G01R 31/382–385; G01R 31/387;
(Continued)

(56) References Cited

U.S. PATENT DOCUMENTS

| 5,773,962 A | 6/1998 | Nor |
| 6,181,103 B1 | 1/2001 | Chen |

(Continued)

FOREIGN PATENT DOCUMENTS

| DE | 10-2012-209179 A1 | 12/2013 |
| WO | 2018/142139 A1 | 8/2018 |
| WO | 2019/223845 A1 | 11/2019 |

OTHER PUBLICATIONS

International Search Report dated Feb. 25, 2021 issued in Patent Application No. PCT/DK2020/050376.

(Continued)

*Primary Examiner* — Patrick Assouad
*Assistant Examiner* — Demetrius R Pretlow
(74) *Attorney, Agent, or Firm* — Pearne & Gordon LLP

(57) ABSTRACT

The invention relates to an energy storage comprising a plurality of series connectable energy modules connected to a string via a plurality of switches. Wherein a string controller controls which of the energy modules that are part of a current path through the string by control of the status of the switches. An energy storage monitoring system is monitoring an energy storage element operating parameter of an energy module, the energy storage monitoring system comprises: a current sensor and a plurality of energy module print. The plurality of energy module prints establishes an energy module operating parameter of the associated energy module. The current sensor establishes the current in the current path. The string controller is configured for bypassing an energy module based on information of status of (Continued)

the switches, the measured current in the current path and the battery operating parameter measured at the energy modules.

20 Claims, 3 Drawing Sheets

(51) Int. Cl.
*H01M 50/51* (2021.01)
*H02J 7/00* (2006.01)

(52) U.S. Cl.
CPC .......... *H02J 7/0013* (2013.01); *H02J 7/0047* (2013.01); *H02J 7/0049* (2020.01); *H01M 2010/4271* (2013.01); *H01M 2010/4278* (2013.01)

(58) Field of Classification Search
CPC . G01R 31/392; G01R 31/396; H01M 10/425; H01M 10/482; H01M 50/51; H01M 2010/4271; H01M 2010/4278; H02J 7/0013; H02J 7/0014; H02J 7/0024; H02J 7/0047–0049; H02J 7/005; H02J 7/024; Y02T 10/70; Y02T 10/92; B60L 3/0046; B60L 3/04; B60L 3/12; B60L 3/19; B60L 3/21; B60L 3/22
See application file for complete search history.

(56) References Cited

U.S. PATENT DOCUMENTS

| | | | |
|---|---|---|---|
| 6,741,065 B1 | 5/2004 | Ishii et al. | |
| 7,352,155 B2* | 4/2008 | Li | G01R 31/396 320/120 |
| 7,573,236 B2* | 8/2009 | Sugimoto | B60L 58/22 320/132 |
| 8,130,501 B2* | 3/2012 | Ledezma | H05K 7/14 363/71 |
| 9,035,612 B2* | 5/2015 | Feuerstack | H02J 7/0014 320/122 |
| 2003/0030442 A1* | 2/2003 | Sugimoto | H02J 7/0048 320/136 |
| 2006/0097699 A1* | 5/2006 | Kamenoff | H02J 7/0048 320/132 |
| 2009/0066291 A1 | 3/2009 | Tien et al. | |
| 2009/0091294 A1* | 4/2009 | Gong | H02J 7/0016 320/122 |
| 2011/0313698 A1* | 12/2011 | Inoue | G01R 19/14 324/617 |
| 2014/0015488 A1* | 1/2014 | Despesse | H01M 10/441 429/7 |
| 2014/0035361 A1* | 2/2014 | Schmidt | B60L 58/22 307/10.1 |
| 2015/0137764 A1* | 5/2015 | Kessler | H02M 7/49 320/118 |
| 2016/0075254 A1* | 3/2016 | Chang | B60L 58/27 307/10.7 |
| 2016/0097819 A1* | 4/2016 | Ohkawa | G01R 31/389 324/430 |
| 2017/0115356 A1* | 4/2017 | Fetzer | B60L 58/12 |
| 2017/0126032 A1 | 5/2017 | Beaston | |
| 2018/0115356 A1 | 4/2018 | Jain et al. | |
| 2018/0233931 A1* | 8/2018 | Beaston | H02J 13/00002 |
| 2018/0306866 A1* | 10/2018 | Tamegai | G01R 31/3648 |
| 2019/0103750 A1* | 4/2019 | Kristensen | H01M 10/441 |
| 2019/0214833 A1* | 7/2019 | Li | H02J 7/00718 |
| 2019/0273228 A1* | 9/2019 | Takahashi | H01M 50/298 |
| 2020/0044459 A1* | 2/2020 | Lee | H02J 7/00036 |
| 2020/0144830 A1* | 5/2020 | Muenzel | H02J 7/0016 |
| 2020/0235439 A1* | 7/2020 | Frost | H01M 10/4257 |
| 2020/0343742 A1* | 10/2020 | Bacquet | H02J 7/0024 |
| 2021/0265710 A1* | 8/2021 | Muenzel | H02J 7/0016 |
| 2022/0385080 A1* | 12/2022 | Bijlenga | H02J 7/0024 |
| 2023/0231210 A1* | 7/2023 | Joos | H02J 7/0024 429/90 |

OTHER PUBLICATIONS

Written Opinion dated Feb. 25, 2021 issued in Patent Application No. PCT/DK2020/050376.
Danish Search Report dated Jun. 11, 2020 issued in Patent Application No. PA 2019 70832.

* cited by examiner

MONITORING SYSTEM FOR AN ENERGY STORAGE

FIELD OF THE INVENTION

The invention relates to an energy storage with improved monitoring capabilities of the energy storage modules hereof.

BACKGROUND OF THE INVENTION

DE102012209179 discloses an energy storage comprising a string comprising a plurality of battery modules. Each of the battery modules are connected to the string via a plurality of switches. The status of the switches is controlled by a controller to establish a desired output of the energy storage without specifying how the switches are controlled to establish this desired output or monitor the energy storage.

SUMMARY OF THE INVENTION

The present invention solves the above problem by establishing one current measurement of the energy storage and based hereon is able to determine e.g. state of charge of the individual energy modules of the energy storage.

The present invention relates to an energy storage comprising a plurality of series connectable energy modules forming a string of energy modules. Each of the energy modules are connected to the string via a plurality of switches. A string controller is configured for controlling which of the energy modules that are part of a current path through the string by control of the status of a plurality of switches. An energy storage monitoring system is configured for monitoring at least one energy module operating parameter of the plurality of energy modules, the energy storage monitoring system: a current sensor configured for communicating with the string controller, and a plurality of energy module print. Each of the energy modules are associated with one of the pluralities of energy module prints and wherein each of the plurality of energy module printed circuit board is configured for communicating with the string controller. The plurality of energy module printed circuit boards are configured for establishing an energy module operating parameter of the associated energy module and provide the established energy module operation parameter to the string controller. The current sensor is configured for establishing the current in the current path through the string and provide the current to the string controller. The string controller is configured for by-passing an energy module based on information of status of the plurality of switches, the measured current in the current path through the string and the energy module operating parameter measured at the energy modules.

The energy modules are series connected via the plurality of switches, hence depending on the status of the switches (controlled by the string controller) a particular energy module is included in or exclude from the current path through the string. Accordingly, even though a particular energy module is not included in the current path, it may be referred to as being part of the string. This is because the current flows through some of the switches, not through the energy module elements.

An energy storage should be understood as one or more strings of series connected energy modules. Energy modules should be understood as an energy storage module comprising a plurality of energy storage elements. Energy storage elements are preferably batteries but could also be capacitors.

A string should be understood as a plurality of series connected energy modules. Each individual energy module is series connected via one or more of the plurality of switches.

The plurality of switches is preferably provided on a printed circuit board which may be referred to as a switching module. The switches are controlled by the string controller and by control hereof it is possible to either include the energy module or by-pass the energy module from the current path through the string. The status of a switch in this document is referred to as either conducting mode or non-conducting mode.

A string controller should be understood as the controller receiving information from the current sensor and from the energy module print. The string controller knows the status of the switches in that they are controlled by the string controller (including historic use/status of the modules), hence based on this information the string controller is able to determine the most optimised way of operating the string i.e. determine which energy modules that should be included in the current path through the string at what point in time. Hence, the string controller receives information regarding string current and know which modules that are connected to the string to establish/absorb (discharge/charge) this current and preferably also hardware configuration of the energy module. This information is used to determine which energy modules that is going to be used i.e. connected to the string according to an overall control strategy such as balancing state of charge, etc. or according to temperature, state of health, etc.

Further, the invention is advantageous in that it has the effect, that the string controller is able to balance the energy modules connected to the string with the power required from the energy storage. Balancing should here be understood as selectively connecting energy modules to the string in dependence of e.g. state-of-health so as to only use a particular energy module at low temperatures or when the current demand is low, cell balancing and balancing of SOC (SOC; State of Charge) of the energy modules.

The invention is advantageous in that the combination of knowledge of status of the switches and the measured current of the current path eliminates the need of a current sensor in each energy module. Leading to reduced costs and reduced footprint of the energy module print, while still enabling the string controller to for example determine the SOC or other operating parameters of individual energy modules. Accordingly, determination of SOC of individual energy modules and control of the current path through the energy modules can be controlled by the string controller without any need for processors on the energy module print and further without need for, for example, current sensors in each energy module.

According to an exemplary embodiment, the state of charge of the individual energy modules is established by the string controller based on information of status of the plurality of switches, the measured current in the current path through the string, energy module operating parameter and/or measurements established by sensors of the associated energy module print.

In an implementation according to the invention, SOC of one energy module may be determined by integrating the multiplication of the current of the current path through the string with the status of the switches of the energy module, for example H-bridge switches. Advantageously, SOC may thus be determined as the integration of the current multiplied by the H-bridge status. Advantageously, contrary to measuring current in all energy modules, this method of determining state of charge only requires a measure of the current through the string, and so only requires a single current sensor.

In an implementation of the invention, it may be preferred to adjust the calculated SOC for an individual energy module for a standby consumption of for example the energy storage monitoring system when determining state of charge of an energy module. This may be achieved by adding a constant to the calculation of state of charge, wherein the constant represents the consumption of for example the energy storage monitoring system, of the energy module printed circuit board comprising sensors, etc. i.e. what could be referred to as standby power consumption.

This is advantageous in that it improves the accuracy with which the state of charge of the energy module may be determined.

The status of switches may be understood as a status of whether the energy module is bypassed, or whether the current runs through the energy module from plus to minus or whether the current runs through the energy module from minus to plus. Accordingly, a value of 1 may for example represent a status wherein the current runs from plus to minus through the energy module, while a value of −1 may represent a status where the current runs from minus to plus through the energy module, and a value of 0 may represent a status wherein the energy module is bypassed. Hence, the switch status in this document may be a reference to 1, −1 or 0.

By energy module operating parameters should be understood capacity, OCV curve, protection limits, SOC, State of health, etc. By measurements should be understood temperature, voltage, etc. The measurements could also be operation parameters. The associated energy module printed circuit board should be understood as the energy module printed circuit board that is part of the energy module the status of which is established.

According to an exemplary embodiment, the state-of-health of the individual energy modules is established by the string controller based on information of status of the plurality of switches, the measured current in the current path through the string, energy module operating parameter and/or measurements established by sensors of the associated energy module print.

This is advantageous in that it has the effect, that state of charge/health of the individual energy modules can be established without a current sensor in each of the battery monitoring modules associated with the energy modules leading to reduced cost and less complicated design and layout.

According to an exemplary embodiment, the current sensor is located in the current path upstream the first energy module of the string of energy modules or downstream the last energy module of the string of energy modules.

Locating the current sensor in the upper part i.e. before the first energy module of the current path is advantageous in that it has the effect, that the layout of the energy storage is less complicated. It should be noted that the current sensor could be located anywhere in the current path including between energy modules and in the neutral end which could be an advantage if the voltage is high in that this location would then not require the same insulation as if it was located upstream the first energy module.

According to an exemplary embodiment, the energy module printed circuit board comprises a voltage sensor. It should be mentioned that a reference to an energy module printed circuit board should be understood as a reference to a battery monitoring module including a voltage sensor and comprising a data storage comprising information of the energy module. In embodiments, the voltage sensor may not necessarily be part of the energy module printed circuit board but only communicatively connected thereto.

According to an exemplary embodiment, the energy module printed circuit board comprises information of the energy module, wherein the string controller gets access to this information when the energy module is installed in the string.

This is advantageous in that it allows the string controller to control the current path through a string comprising different types energy modules e.g. an energy module of 50 Ah and an energy module of 100 Ah and also different voltages. The information may be uploaded automatically to the string controller or the string controller may check/consult the information whenever needed.

Initially, the string controller is updated with energy module information from all energy module prints thereby obtaining information of number of energy module elements in the energy module, type of energy module element, capacity of the energy module element/module, OCV curve based on which state of charge can be estimated based on battery voltage, etc. Then, if an energy module is replaced, the battery monitoring module is also replaced and when a new energy module is installed, it comprises a new battery monitoring module comprising information of the new energy module.

According to an exemplary embodiment, the energy module printed circuit boards are daisy chained and wherein the first and the final energy module printed circuit board in the chain are connected to the string controller. This is advantageous in that it has the effect, that in case one energy module printed circuit board or the connection between two energy module printed circuit board are damaged the downstream energy module printed circuit board may still communicate with the string controller.

According to an exemplary embodiment, the energy module printed circuit board comprises at least a temperature sensor, a voltage sensor and a memory. This is advantageous in that it has the effect, that the string controller is able to use temperature and voltage in e.g. determination of State Of Charge (SOC; State OF Charge) of the energy module and determine if an energy module can be used e.g. due to temperature dependent capacity.

The memory is used to store data related to the energy module and temporary data related to measurements performed by the energy module. In contrary to known battery monitoring systems, the energy module printed circuit board of the present invention does not in an embodiment comprise a microcontroller for processing the data. Hence, the energy module printed circuit board is passive in the sense that they are not processing data, only measuring and storing.

According to an exemplary embodiment, the energy module operating parameter is selected from the list comprising: current, temperature and voltage. This is advantageous in that it has the effect, that measurements of such operation parameters of e.g. battery element can be used by the string controller to determine if an energy module is not ready for operation and should be by-passed.

According to an exemplary embodiment, each energy module comprises a plurality of energy module elements, preferably a plurality of battery elements. This is advantageous in that it has the effect, that the resolution of the output voltage from the energy storage can be controlled by the number and/or size of the energy module elements comprised by an energy module.

According to an exemplary embodiment, the plurality of switches is implemented in an H-bridge. This is advantageous in that it has the effect, that the inclusion of the individual energy modules in the current path through the string can be controlled. Further, it is advantageous in that it has the effect, that the energy module elements behind the H-bridge can be either charge or discharged in dependency of the status of the H-bridge switches. Further, the polarity of a battery can be changed by controlling the status of the H-bridge switches.

According to an exemplary embodiment, the energy storage comprises at least three strings each controlled by individual string controllers. This is advantageous in that it has the effect, that the energy storage can establish three-phased output and thereby be used in a three-phased system. An example of such three-phased system could be the auxiliary system of a wind turbine or the utility grid. With this said, one string controller/energy storage controller could be capable of controlling several strings within the scope of the invention.

According to an exemplary embodiment, the energy storage comprises an energy storage controller communicating with the string controllers. This is advantageous in that it has the effect, that the energy storage controller can act as a master controller controlling the string controllers comparable to slave controllers. In this way, the energy storage controller may provide setpoints, control strategies, etc. to the string controllers. Such control strategies may at least partly be established by input received by the energy storage controller from controllers, sensors or users external to the energy storage.

According to an exemplary embodiment, the energy module printed circuit board is located at the end of an enclosure for enclosing the energy module facing a back side of an electric cabinet in which the energy module enclosure is installed.

According to an exemplary embodiment, the electric interface of the switches of the energy module is located at the end of an enclosure for enclosing the energy module facing a back side of an electric cabinet in which the energy module enclosure is installed. This is advantageous in that it has the effect that mounting or replacing of one or more energy modules in an energy module string can be made fast and easy.

According to an exemplary embodiment, the string controller is configured for estimating if an energy module is faulty by comparing the sum of energy module voltage received from the energy module prints to the string voltage received from the string voltage sensor. This is advantageous in that it has the effect that the string controller can estimate a faulty energy module from already existing voltage measurements.

According to an exemplary embodiment, the printed circuit board comprising the plurality of switches and the energy module printed circuit board are paired together communication-wise, so that the string controller knows that when switches of the printed circuit board is activated, the respective energy module and energy module printed circuit board are being used.

This is advantageous in that it has the effect that if either energy modules or communication cables or H-bridge PWM signal cable is swapped during installation of the energy storage in the field, the string controller will be informed which energy module and switching board that is coupled together. Note, that the printed circuit board is also referred to as switching board or switch printed circuit board.

According to an exemplary embodiment of the invention, the energy storage is a high power energy storage for supplying for example stationary loads such as loads in a wind turbine. Further, it is within the scope of the invention to supply an electric grid. Referring to this particular embodiment of the invention, stationary load should be understood as a load that does not change its geographic position i.e. even if a motor located in the hub of a wind turbine is rotating it is considered stationary, whereas e.g. a motor of a vehicle in this context is considered as not stationary in that the vehicle moves from one location to another. Advantageously, typically the energy modules of the energy storage are therefore located and mounted in one or more upright electric panels, which can be manufactured at a factory, transported to site of the wind turbine and installed in the wind turbine.

According to an exemplary embodiment of the invention, the energy storage comprises at least two energy module strings, for example, at least three energy module strings.

This is advantageous in that it has the effect, that the energy storage can establish three-phase voltage and thereby be used in a three-phased system. An example of such three-phased system could be the auxiliary system of a wind turbine or the utility grid.

Advantageously, each energy module string may be controlled by an individual associated string controller.

The present invention may further relate to a method of determining state of charge of at least one energy module of a plurality of series connectable energy modules; wherein the plurality of series connectable energy modules forms a string of energy modules; wherein each of the energy modules are connected to the string via a plurality of switches configured in an H-bridge and located on a switch printed circuit board; wherein a string controller is configured to control which of the energy modules that are part of a current path through the string by control of the status of a plurality of switches; wherein the method of determining state of charge is performed by the string controller according to the following steps:

from a current sensor, receive a value of measured current in the current path, select at least one of the energy modules of the string, determine a status of the switches controlling the at least one selected energy module, determined the polarity of the current of the at least one selected energy module, and establish the state of charge of the at least one selected energy module by performing an integration of the current of the at least one selected energy module.

This is advantageous in that contrary to measuring current in all energy modules, this method of determining state of charge only requires a current measure of the string, and so the method can be implemented with only a single current sensor.

Further this is advantageous in that, due to the establishing of the polarity of the current of the selected energy module, the integration of the energy module/current path current, performed by the string controller, can establish the state of charge of the energy module when an AC load is supplied i.e. with constant discharge of the energy module over time (as long as it is included in the current path) independent of the polarity of the current seen from the AC load.

This current sensor may be implemented and located in the current path external to each of the plurality of energy modules. Further, the selected switching module may be associated to any energy module whether it is connected to the string or not. Further, the polarity of current of the selected energy module may be determined by multiplying the current measured in the current path with the status of the switches associated with the at least one selected energy module.

The status of the switches controlling the selected energy module should be understood as a plus, minus or zero depending on if current flow from plus or minus of the energy module or if the module is bypassed.

According to an exemplary embodiment of the invention, the method is implemented in an energy storage.

According to an exemplary embodiment of the invention, the state of charge is adjusted by an energy module monitoring consumption constant.

This has the advantage, of increasing the accuracy with which state of charge is determined in addition to consumption from the load, internal energy module consumption or standby consumption which may also be included in the state of charge calculation. It should be understood that the energy module monitoring consumption constant may for example represent the consumption of an energy storage monitoring system for example comprising sensors, etc. The energy module monitoring consumption may further refer to the standby consumption of for example an energy storage monitoring system of the energy module.

According to an exemplary embodiment, the state of charge of a bypassed energy module may be determined by integrating the energy module monitoring consumption constant.

This has the advantage that the state of charge of an energy module can be determined even if the energy module has only been bypassed by the string controller. Advantageously, state of charge may then be determined by accounting for the power consumption of the energy storage monitoring system, which may consume energy even if the energy module is bypassed. Hence, during a time period where the energy module has not been in use, the state of charge is reduced due to internal consumption, and state of charge change is detectable by the present invention.

THE DRAWINGS

For a more complete understanding of this disclosure, reference is now made to the following brief description, taken in connection with the accompanying drawings and detailed description, wherein like reference numerals represent like parts:

DETAILED DESCRIPTION

Figure 1:
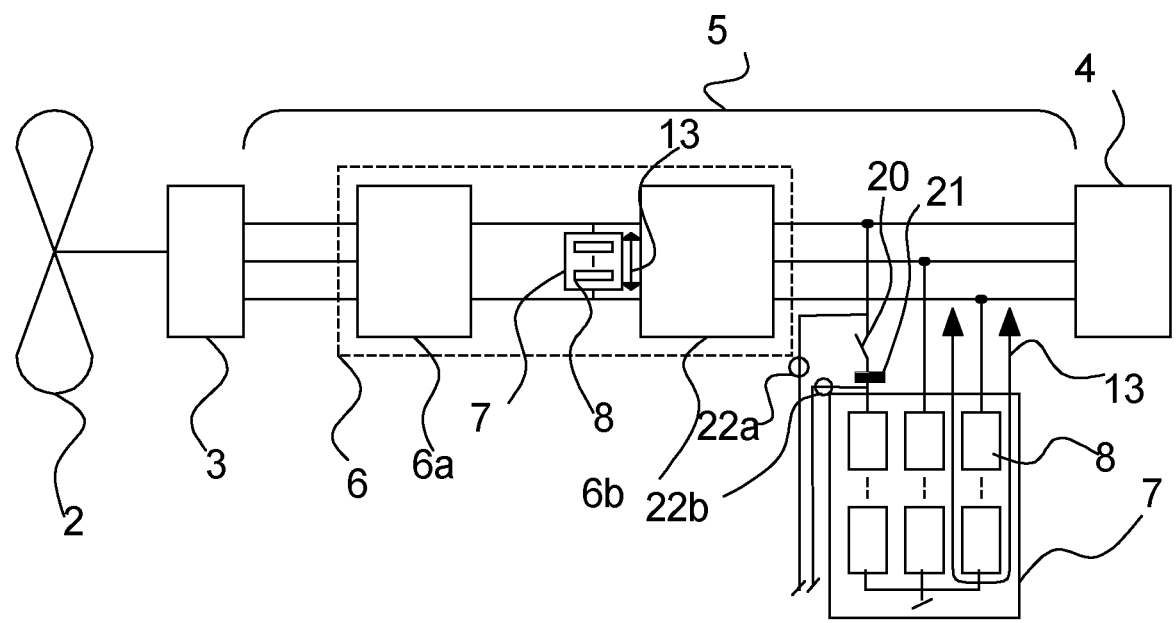
FIG. 1 illustrates an energy storage implemented in a wind turbine.

The energy storage 7 of the present invention, can be used in several applications and for several reasons. To list a few, the energy storage 7 could be connected to the output of a generator of a wind turbine. FIG. 1 illustrate elements of a wind turbine 1 relevant for the present invention. The wind turbine 1 comprises a rotor 2 which via a shaft is connected to the rotor of a generator 3. Hence, the generator is generating a current at its output when its rotor is rotated.

The output of the generator 3 is connected to a first end of an electric current path 5, the second end of which is connection to the utility grid 4. Between the generator 3 and the utility grid 4 a converter is located in the electric current path 5. The converter 6 comprises a generator side converter 6a connected to a grid side converter 6b via a direct current (DC) link. Other configurations of a wind turbine may also be suitable for use with the present invention.

The energy storage 7 can be used in relation to all types of energy systems including wind turbine converters including DFIG (DFIG; Doubly Fed Induction Generator) converters, Full power 2 level back-to-back, Full power 3 level back-to-back, MMC (MMC; Modular Multi-Level Converter), etc. The energy storage 7 can be located between the converter 6 and the grid 4, in fact, it can be connected either in the dc link or between the converter and the transformer including a stator path of a DFIG configuration, in fact, it can be place on any AC or DC power line. Further, the energy storage 7 can be used in relation to all types of wind turbine generators including Induction Generator, Permanent Magnet Sync. Generator, Doubly Fed Induction Generator, Synchronous Generator, etc. Further, the energy storage 7 can be used external to a wind turbine or other renewably energy generation systems.

Further, FIG. 1 illustrates two energy storages 7 connected to the electric current path 5. It should be mentioned that typically only one energy storage 7 will be connected to the electric current path 5, hence the illustration on FIG. 1 only served to illustrate examples of where at the electric current path 5, the energy storage 7 preferably can be connected. With this said two or more parallel energy storages can be connected to facilitate charging and discharging at the same time.

In an exemplary embodiment, an energy storage comprises three strings each connected to one phase of the current path by a contactor 20 and an inductor 21. On FIG. 1 this is illustrated with respect to a wind turbine, but as indicated, the energy storage could be connected to one or more phases of a utility grid 4. It should be noted, that the inductor 21 can be located anywhere in the string and not only as illustrated on FIG. 1. Further, it should be noted that, the energy management system of the energy storage may measure the string voltage by a voltage sensor 22a, 22b one or both sides of the contactor 20. On FIG. 1, only one string voltage sensor is illustrated, however it is understood that the voltage of each string can be measured as illustrated.

Further, the energy storage 7 can be used external to a wind turbine or other renewably energy generation systems as energy storage or grid support. One or more energy storages 7 can be used as power supply to ships either when these are in harbour or between harbours to reduce used of fossil fuel generators and to reduce load on the electric grid of the harbour. In the following only one string of one energy storage 7 is illustrated for simplicity, but the described principles could be used with several serial or parallel strings and several serial or parallel energy storages. A string may be referred to as an energy storage string or battery string.

Figure 2:
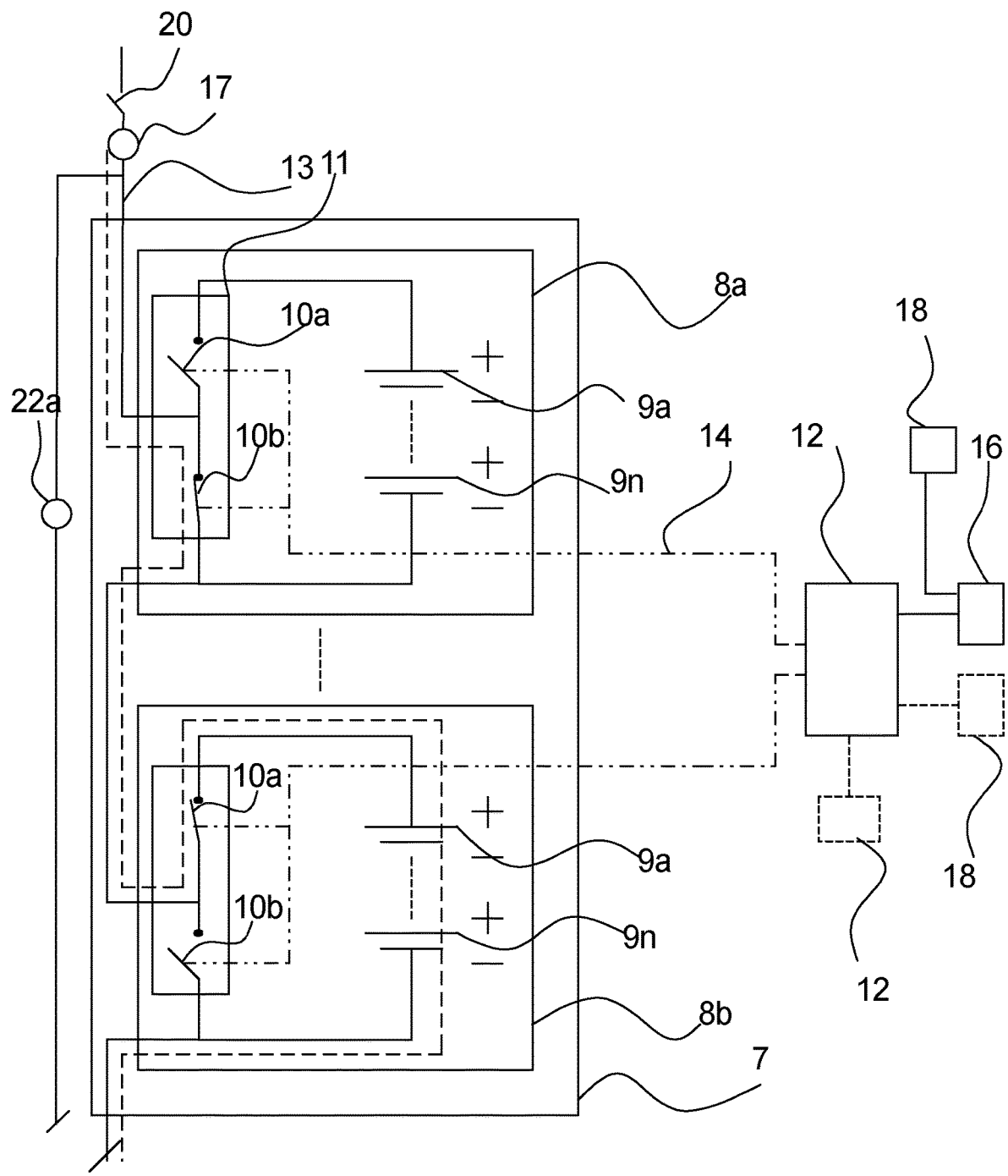
FIG. 2 illustrates energy storage modules of the energy storage.

FIG. 2 illustrates the principles of the design of an energy storage 7 including the minimum elements of the energy storage 7. The energy storage 7 is built of a plurality of energy modules 8. Each of the energy modules 8 comprise a plurality of switches 10 of which two are illustrated 10a, 10b and at least one energy module element 9. The status of the semiconductor switches 10 is controlled by a string controller 12 and thereby, the string controller 12 is controlling a current path 13 through the energy modules 8 of the string of energy storage modules of the energy storage 7. It should be mentioned, that the current path 13 could also be considered to pass through an energy module 8 even though the energy module element 9 hereof is by-passed in that it passes through one or more switches 10 of the module.

It should be mentioned, that the plurality of semiconductor switches 10 in an exemplary embodiment counts four forming an H-bridge. This is because the energy storage 7 is able to comply with AC current and voltage i.e. both negative and positive polarity and still be able to bypass the energy module 8 as described above. In an exemplary embodiment, the switches 10 are mounted on a printed circuit board also referred to as a switching board 11.

It should be mentioned that while FIG. 2 shows an embodiment of the invention in which the string controller 12 and the energy storage controller 18 is located outside of the energy storage 7, it should be mentioned that the string controller 12 and energy storage controller 18 may typically be part of the energy storage 7.

The controller 12, also referred to a string controller, may be any kind of industrial micro-controller, PLC (PLC; Programmable Logic Controller) and may communicate with other string controllers (not illustrated), other string controllers 12, external controllers 16 or energy storage controller 18. The external controller could e.g. be a wind turbine controller, service provider, grid administrator, wind power plant controller, etc. Alternatively, it is the energy storage controller 18 which is communicating with the external controller 16. The energy storage controller 18 may coordinate switching and thereby bypassing energy modules 8 in one, two, three or even more strings. Further, if possible, the energy storage controller 18 may control series connection of one or more strings.

The way of the current path 13 through the energy storage 7 is determined by the status of the semiconductor switches 10 and is therefore controlled by the string controller 12 (indirectly or via a reference by the external controller 16 or energy module controller 18). The status of the semiconductor switches 10 is determined based on availability of energy module elements/energy modules 8, 9, health status of the energy module elements/energy modules 8, 9, state of charge of the energy module elements modules 8, 9, charging voltage available, desired/required voltage across/from the energy storage 7, health/wear of switches, etc. The status of a semiconductor switch 10 is changed between a conducting mode (switch closed) and a non-conducting mode (switch open). A deadtime between change from one status of the switch to another status is preferably adjustable between 10 nanoseconds and 1 microsecond, typically the value is a couple of 100 nanoseconds.

The availability of an energy module element 9/energy module 8 may refer to a defect energy module element/energy module, in this case an energy module 8 will not be available. The health status of an energy module element 9 may refer to the number of times the particular energy module element 9 has been charged/discharge. The higher number, the closer to end of life time of the energy module element 9 hence, the controller 12 may keep track of this number and activate energy modules 8 trying to keep this number more or less the same for all energy module elements 9 of the energy storage 7. This can be controlled by control of the switches 10 and thereby the current path through the string of energy modules 8. In the same way, health of switch can also be estimated based on the number of times it has been switches.

The energy storage 7 illustrated in FIG. 2 comprises a first energy module 8a and a second energy module 8b each including a plurality of energy module elements 9a, . . . , 9n. The energy module elements 9a-9n of the first energy module 8a are bypassed because of the non-conducting status of switch 10a and the conducting status of switch 10b. The energy module elements 9a-9n of the second energy module 8b is included in the current path 13 because of the conducting status of switch 10a and the non-conducting mode of switch 10b.

The status of the switches 10 is as mentioned controlled by controller 12 communicating with the switches 10 via control signal path 14. The controller 12 is preferably also connected to an external controller 16 which may be implemented as a wind turbine controller or wind park controller. The controller 12 receives input from an energy monitoring module which is described below comprised by an energy storage monitoring system. The energy storage management may when the elements 9 are batteries be referred to as battery management system.

The number of strings of an energy storage 7 may vary between 1 and 25 or even more, typically the number of stings reflects the number of phases and/or consumption of the system to which the energy storage is connected. In the strings, the energy storage modules 8 are series connected and each string typically comprises between 1 and 20 energy storage modules 8, preferably between 5 and 15. The number of energy modules 8 and thereby energy module elements 9 is determined by the desired voltage over the energy storage 7/one string which is preferably higher than the peak voltage of the grid 4. The storage capacity of the energy storage 7 is determined by the application in which the energy storage is used. Further, the number and type of energy module elements 9 of the energy modules 8 may vary like the energy modules 8 does not have to be identical within the energy storage 7. This is also true even within the same strings. Just as long as the string controller 12/energy storage controller 18 is updated with information of what is behind the individual switch boards 11.

Preferably, the switches are semiconductor switches 10 of the IGBT (IGBT; Insulated Gate Bipolar Transistor), MOSFET (MOSFET; Metal-Oxide-Semiconductor Field-Effect Transistor) type, GaN transistors (Gan; Gallium Nitride) or SiC transistors (SiC; Silicon Carbide), however other types of switches can also be used.

Preferably, commodity switches 10 are chosen in that they are well tested, low in price and their availability on market is high. The commodity switches are typically not designed for operation in high voltage (e.g. above 1000V) and with high currents (e.g. above 500 A) so the number of this type of switches is higher compared to designs using switches designed for higher voltage and currents. However, the increased number is compensated by the lower price of the commodity switches. A preferred type of switch 10 for use in the present invention is designed to currents of 100 A and voltages of 50V. At higher voltages of the preferred types of switches, the on-resistance of the semiconductor switch 10 is increasing and thereby the power loss in the switch 10.

Preferably, a reference to energy module element 9, is a reference to a plurality of energy storage elements connected in series. The number of energy module elements may vary, between 2 and 25 or even more in one column of series connected energy module elements 9. A typical column comprises between 5 and 20 series connected energy module elements 9. The number of energy module elements 9 in a column depends on requirements of the energy storage 7 and according to a compromise between few cells 9 leads to low price and reduced power loss while many cells 9 reduces the harmonic current contribution and leads to a more reliable system in that the redundancy/flexibility in control is increased.

The energy module elements 9 are preferably of the li-ion type since the characteristics of this battery type complies with the requirements of the energy storage 7 and the environment of a wind turbine. With this said, other battery types may also be used. As an example, one energy module element 9, may be a 3.2V element which when connected with e.g. 14 similar cells 9 leads to a 48V battery pack within one energy module 8. Hence in this example, the energy module 8 comprise one 48V battery which can be controlled by the switches 10 of the energy module 8. The capacity of the energy module elements 9 is preferably between 10 Ah and 200 Ah or even higher, but as mentioned this is a design choice based on requirements to the energy storage 7 and prices of the system. Especially in the preferred embodiment where the switches 10 are mounted on a PCB, the maximum current is determined as the lower of the maximum current allowed through the current path of the PCB and the maximum battery current. In case the semiconductors 10 are not mounted on the PCB the current limiting factor is the current limit of the converter.

It should be mentioned, that the reference to energy module elements 9 in embodiments could include capacitors, hence an energy module 8 could include capacitors, batteries or a combination hereof.

It should be noted, that the energy storage 7 including energy storage modules 8 preferably is located inside an electric cabinet. The electric cabinet protects the energy storage from environmental impact and may help maintaining a desired temperature, direct flow of cooling air, etc. Locating the energy storage in an electric cabinet is advantageous in that it is possible to located in sites of e.g. a wind turbine or other extreme sites.

The energy storage 7 comprises an energy storage monitoring system, which for each of the strings comprises only one current sensor 17 (for the whole string) and a voltage sensor 15 for each of the energy modules 8. The current sensor 17 can be located at any position in the string in that the current in the current path 13 through the string is the same in the entire string. The energy storage monitoring system comprises an energy storage printed circuit 19 comprising a memory 24 and, in an embodiment, preferably also the voltage sensor 15 and in an embodiment also a temperature sensor 23.

Energy module operation parameters or simply operation parameters such as the voltage of the energy module elements 9 of an energy module 8 varies over time e.g. due to wear of the energy module elements 9, temperature, etc. Further, because the energy modules 8 are individual controllable, the number of energy module elements 9 connected in series in a string may vary in that sometimes an energy module 8 is not included in the current path of the string. Hence, for the string controller 12 to have the full overview of the voltage of a string each energy module needs a voltage sensor 15.

The voltage sensor 15 is preferably implemented as an integrated circuit on the energy module printed circuit board 19 having electric connections so that it is able to measure the voltage over the individual elements 9.

It should be mentioned, that in addition to the voltage sensor, in an embodiment, the energy storage monitoring system also includes a temperature sensor (not illustrated). The temperature sensor may be located to be able to establish ambient temperature i.e. temperature inside the cabinet comprising the energy storage 7 or located in each of the individual energy modules for measuring the temperature hereof. Several temperature sensors may be implemented depending on which temperatures are relevant.

It should be understood that the energy storage monitoring system has a standby power consumption, which may advantageously be adjusted for when determining the state of charge of an energy module. One way of accounting for this consumption that cannot be measured by the current sensor is to calculate or estimate the consumption of an energy module. This estimation of power consumption may be common for all modules or made individually for each module. It may also account for losses or consumptions that is associated with the energy storage, string, switches, etc. as such. The estimated power consumption may be converted into a constant that is multiplied or in another way accounted for in the integration of the current measured by the current sensor.

In embodiments if e.g. total string SOC or capacity is to be established, the constant may be integrated alone to determine a change of SOC of an energy module that has not been in use i.e. has been bypassed for a period for time.

The string controller 12 may receive input of operation parameters such as ambient temperature, voltage/voltage reference of the system to which the energy storage 7 is connected to, current/current reference of the system to which the energy storage 7 is connected to, etc. from sensors and external controllers. This together with information received from the current sensor 17, voltage sensors 15, 22, temperature sensor (if any) and information stored on the memory 24, the controller 12 is using to determine e.g. state of charge/state of health of the individual modules 8, direction of current flow in the current path 13, establish desired voltage (in terms of type (AC/DC), and size), frequency or power compensation, etc.

It should be mentioned that voltage and current can be established by measuring at least two of the lists comprising voltage, current, knowledge of power, resistance, etc.

Figure 3:
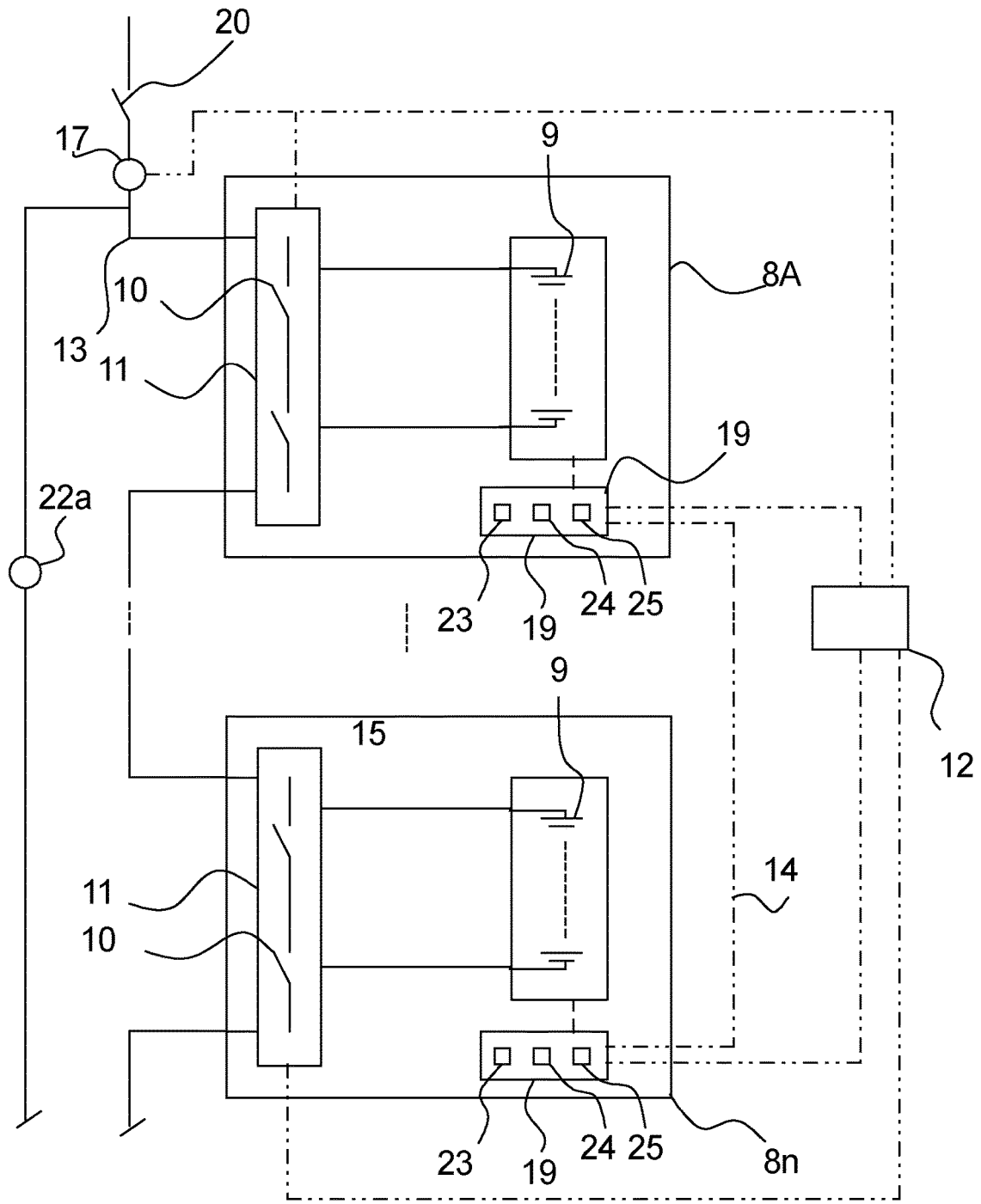
FIG. 3 illustrates energy storage modules comprising energy storage monitoring system according to the present invention.

Referring to FIG. 3, the plurality of semiconductor switches 10, may be installed on a printed circuit board 11 (so-called switching board). This is advantageous in that mass production of such switch printed circuit boards is possible which reduces costs and allows the use of standard, available and well tested components. Further, for applications of the energy storage 7 which is operating in a current range between 0 and 200 A it is possible to avoid expensive high power switches which also contribute to a cost reduction of the energy storage 7 in such exemplary embodiment. In an embodiment, the switches 10 are controlled by gate drives also located at the switching board 11 based on gate signals received from the string controller 12 via an energy module printed circuit board 19 (referred to as energy module print).

The energy module printed circuit board 19 is communicatively connected to the string controller 12 via a data communication interface/communication protocol that use wireless or wired signal path 14. The energy module printed circuit board 19 includes information of the energy module elements 9 of the energy module 8. Hence, in the memory 24 of the energy module printed circuit board 19 at least some of the following is stored, type of energy module element 9 (battery, capacitor, etc.), number of energy module elements 9, capacity of such energy module element 9 (e.g. 25 Ah and 50 Ah) and thereby of the entire energy module 8, manufacture of the energy module element 9, production date of print 18 and/or energy module elements 9, installation date of energy module 8 in energy storage 7, times the module 8/elements 9 has been in use, temperature characteristics of the energy elements 9, etc.

Together the voltage sensor 15, current sensor 17, string controller and the energy module printed circuit board 19 are referred to as battery management system. The energy module printed circuit board 19 may include communication interface between switch board 11 and the string controller 12 and provide information of the energy module elements/energy module to the string controller. Further, it should be mentioned that the energy module printed circuit board 19 may not comprise a micro-processor, hence the intelligence of the present energy storage monitoring system is centralised in the string controller 12.

Having at least some of all this information available on a memory 24 related to the individual energy module 8 is advantageous in that if an energy module 8 is replaced, the string controller 12 instantly is aware of this and in addition, of the configuration and information of the new energy module. In this way, in one string, it is possible to include (and change from and to) different types of energy modules having different types of energy module elements which can be connected in series and thereby all be part of the current path 13.

As mentioned, the voltage across the individual energy modules is measured by a voltage sensor 15. This voltage sensor 15 may also be part of the energy module printed circuit board 19 and provide information of the voltage level of the energy module elements 9 of the energy module 8 to the string controller 12. The voltage sensor 15 may measure the voltage of the total number of energy module elements 9 and/or measure the voltage of each of the energy module elements 9.

In the same way, the temperature sensor may be part of the energy module printed circuit board 19 and thereby provide temperature information of the energy module 8 and/or energy module elements 9 to the string controller 12.

In the exemplary embodiment of FIG. 3, the energy module prints 19 of the illustrated energy modules 8 are illustrated as being connected in a daisy chain configuration to the controller 12 and in addition, both of the first and last module 8 in a string is connected to the string controller 12. This is advantageous in that it has the effect, that in case a communication line between two energy module prints 18 fails, the controller 12 still have access to all of the energy module prints 19. It should be mentioned, that each individual energy module print, may of course be connected individually to the controller 12.

Accordingly, the string controller 12 receives information of one or more of operation parameters such as current in the current path 13 from the current sensor 17, voltage of the individual energy modules 8 from the voltage sensors 15, temperature, resistance and information from the memory 24/print 19 such as voltage and/or temperature, information of type of energy module elements 9 etc. Together with some of this and some of the historic information of use (including on time of modules, switch state of switches 10) of the energy module that is established by the string controller itself, the string controller 12 is able to determine state of charge of the individual energy module 8 and if one of these has to be charged, by-passed or discharged. Further, based on this information, the string controller 12 is able to determine if an energy module is not performing well and needs to be serviced or replaced. This information can be provided to an external controller 16.

More specifically the string controller 12 based on information of measured voltage and type of energy module element is able to determine if an energy module is fully charged (or discharge) and therefore should be by-passed. A threshold value of e.g. 10% state of charge of the energy module could trigger by-pass of an energy module. Another specific example is that if temperature is measured as being above a threshold temperature, the string controller 12 may also by-pass such energy module. Hence the string controller is able to optimize the control of the energy modules in the string to meet the requirements from the system to which the string is connected and at the same time do this with as little as possible wear of the individual battery modules.

Opposite known battery management systems which are using a current sensor in each module, according to the present invention, it is possible to use only one current sensor 17 per string irrespective of the number of energy storage modules. The reason for this is as mentioned that the current is the same all the way through the string. However, to be able to benefit entirely from the information of current provided by the current sensor it is also necessary for the string controller to know which energy modules that are part of the current path through the string. Since the string controller 12 is controlling some of the above itself, some of the information is directly available to the string controller. Hence, the SOC of the individual energy modules 8 can be estimated without a current sensor of the energy module 8. Furthermore, the SOC may be adjusted for the power consumption of the energy storage monitoring system. This may advantageously increases the accuracy of the determined SOC of the individual module and thus for the string as such.

The type of current sensor is not important hence principles of a Rogowski coil, Hall element, Current Transformer and Zero-flux principles can be used. However, principles allowing measuring of DC current is preferred.

Accordingly, the information provided to the string controller 12 together with the configuration of the switches 10 controlling if an energy module 8 is included in the current path provides a great flexibility in control of the energy storage. The flexibility is increased if the two or more strings of energy modules are connected in parallel and even further if such paralleled string configuration is able to be changed to a series connection by means of switches controlled e.g. by the string or energy storage controller. Just to mentioned some, this means that the string or energy storage controller is able to control cell balancing between cells of an energy module and balancing of state of charge of between the energy modules and stings.

Hence from the present invention it is possible to balance the elements 9 inside the module 8 and based on a reference signal e.g. from the energy storage controller one energy module can be selected to be taken out of operation for the elements 9 thereof to by cycled (i.e. charged and discharged).

Further, if two parallel strings are connected to the same load, and the requirement of the load is less than what one string can deliver it is possible to discharge one while the other is charged.

According to an embodiment of the invention, the energy module printed circuit board 19 is located at the energy module 8 at the end of the energy module that is opposite the front of the energy module. This means that if the energy module is designed to be mounted in a drawer when pushing the drawer into an electric cabinet, the energy module printed circuit board 19 is accessible from the back of the electric cabinet. When each energy module is installed in this way all energy module prints 19 of the energy modules 8 of the string is physically located either next to each other and/or on top of each other. This is advantageous in that mounting of the energy module prints, the string controller and the switches to form and control the current path is easy. In fact, the interface connecting the switches of two adjacent energy modules may be preinstalled in the electric cabinet hence when an energy module drawer is inserted in the electric cabinet its electric conductors connecting the energy module elements hereof are automatically mounted in the preinstalled interfaces.

According to an exemplary embodiment, the switch board 11 and the energy module printed circuit board 19 may be communicatively connected. By linking these two PCBs 11, 19, the string controller 12 can be sure that if it senses a gate signal to e.g. switch board number 3 in the string, that it is also energy module number three in the string that is activated/deactivated. In unfortunate situations where two communication wires from two switch boards 11 to the string controller 12 has been confused, the string controller may think it activates the first, but in reality, it activates the second. By linking the switch board with the energy mould print, this can be avoided. The string controller may run attest sequence to ensure that when activating a certain switch board, the corresponding energy module is also activated. The test sequence may be executed prior to the point in time that the energy storage is put in operation of for the first time.

According to an exemplary embodiment, an energy storage output voltage curve is established by one or more modules of one or more string of the energy storage. As an example, the energy storage needs five energy storage modules to establish a voltage curve. Each of the five energy storage modules adds 50V to the output voltage and they may be connected to the current path through the string in the sequence of 8a, 8b, 8c, 8d and 8e and disconnected from the string in the sequence 8c, 8d, 8b, 8e and 8a. The total contribution from the energy storage modules 8a-8e is the same no matter the sequence of disconnection, as long as the sum of time, the energy storage modules are connected to the string does not change. More particularly, each of the levels of 50V has to be connected to the current path a time period specified by the requirements to the output voltage. Therefore, if an energy storage module has to be connected throughout a time between time T1 and time T2. It does not need to be one particular energy storage module the whole time, but the time could be divided in contributions from several energy storage modules 8. In this way, the output stays the same, but what changes is the on-time of the individual modules. In other words, the on-time of the individual energy storage modules can be better balanced leading to a much better distribution of the wear among the switch module/switches of the energy module 8.

Also, if the output voltage is a DC, the on-time of the individual module can be controlled by the string controller. Since in this example, the energy storage modules are of 50V each, two energy storage modules would have to always be turned on and one energy storage module would have to be turned on 50% of the time to establish an DC output voltage of 125V. One way, the string controller establish that is to always turn on energy storage module 8a, whereas energy storage module 8b and 8e supplies 50V shifting to ensure equal use of these two modules and therefore together with module 8a supplies 100V. The remaining 25V is provided by turning on one module 50% of the time, in this example, this is delivered by module 8c. The on-time of module 8b and 8e respectively and on/off time of module 8c is above a minimum on-time and thus no problems with respect to switching losses and EMI and EMC. However, if the control strategy is to balance the SOC of the individual storage modules 8, different modules can be connected to the current path 13.

In the situation, where the string controller is asked to deliver a current to an AC load or AC grid, the string controller is controlling the individual modules to establish an output voltage complying with the system frequency of the system to which the current is to be delivered. Typically, the system frequency is 50 Hz or 60 Hz in AC systems.

The string controller controls the on-time of the individual modules 8 and often several modules 8 are needed to establish a desired amplitude of the output voltage. The frequency with which the string controller turns on or off the individual modules is in this document referred to as control frequency.

The on-time of an individual module could be referred to as module frequency. The on-time for the individual modules 8 is controlled by the string controller based on information received from all of the individual modules and in addition, maybe also an overall control strategy on how to establish the desired output voltage from the energy module. Hence, the on-time is determined in consideration of e.g. state of charge, state of health, system frequency and other requirements from the system to which the energy storage is connected to, etc. Hence, the string controller may be instructed to deliver 250 VAC and at least 10 A and it is then up to the string controller based on its knowledge of the individual modules 8, control strategy, current sensor input, etc. to determine how many modules that is needed and when these are to be connected to the current path 13.

An additional feature available by the present invention is that it is possible to perform a fault analysis based on voltage measurements. The string controller receives input of module voltage from each of the energy module prints 19 and from the string voltage sensor 22a which is also connected to the string controller. By establishing the sum of module voltages received from the energy module prints 19 and comparing this with the string voltage received from the string voltage sensor 22a, it is possible to determine if a module is faulty. This is at least the case, if the sum received from the prints 19 and the measurement received from 22a is not the same.

If a faulty situation occurs, the string controller may provide information of this to the energy storage controller/external controller. Further, if capacity is available, it can start to exclude one module at the time and in that way find the faulty module.

As mentioned above a power consumption constant may be determined and included in the determination of SOC of an energy module including if the determination is based on integration of current over time. This constant may be dependent on temperature, voltage, internal resistance, etc.

Further, as mentioned above, the determination of SOC includes status of the switches which in the SOC determination is translated to a 1, −1 (minus one) or 0. This is to be able to, over time, integrate a current which from a load connected to the string is seen as an AC current. However, the AC current is established by changing status of the switches and therefore the current through the string is multiplied by 1 or −1 to account for the polarity of the current.

The 0 is multiplied with the current through the string for energy modules that are bypassed, in that such module is not charged/discharged. However, as mentioned in embodiments, the constant representing standby/internal consumption is integrated for bypassed modules or multiplied or added to the current prior to integrating for modules connected to the current path.

Hence, in the situation where a module is bypassed and delivers or draws no current from the string, the state of charge of that module does not change as consequence of the current through the string, hence this current should be multiplied with 0. Only contribution to change of SOC is the internal power consumption of the energy module which can be measured or calculated e.g. by using the power consumption constant.

From the above, it is now clear that compared to known battery management systems, the present invention has moved the distributed intelligence of known battery monitoring system from the individual energy modules into the string controller 12. This is done by gathering information of the energy module in a data memory 24 of the energy module printed circuit board 19. Together with other sources of information of the energy module such as the voltage sensor 15 which is preferably also located on the energy module printed circuit board 19 and the current sensor 17. Hence more intelligent energy modules are developed which are easy to mount and replace with minimal impact on availability of the energy storage.

Based on information of status of the plurality of switches (known by the string controller), the measured current in the current path (measured by current sensor 17) through the string and in some embodiments also the energy module operating parameter measured at the energy modules (measured by voltage sensor 15, temperature sensor, etc.), the string controller is able to determine SOC of the individual modules, which of the modules 8 of the string that with respect to an overall control strategy is best to use, etc. The overall strategy could be to maintain a certain SOC/SHO of each modules 8.

Hence an advantage of the energy storage monitoring system of the present invention, is to stop the use of energy modules if they exceed the temperature, voltage and/or current limit based on the measurements (or calculations based on measurements) hereof. Further, based on these measurements and switch status information, it is possible to provide information regarding the state of charge, state of health, etc. of the energy modules without having a current sensor in each module 8.

LIST

1. Wind turbine
2. Rotor
3. Generator
4. Utility grid
5. Electric current path (through the wind turbine from generator to utility grid)
6. Converter
   a. Generator side converter
   b. Grid side converter
7. Energy storage
8. Energy module
9. Energy module element
10. Semiconductor switch (10a, 10b, 10c and 10d used to distinguish switches of the same energy module)
11. Printed circuit board (switching board)
12. String controller
13. Current path (from the electric current path and through the energy storage)
14. Control signal path
15. Voltage sensor
16. External controller
17. Current sensor
18. Energy storage controller
19. Energy module printed circuit board (energy module print)
20. Contactor
21. Inductor
22. String voltage sensor
23. Temperature sensor
24. Memory of energy module print

The invention claimed is:

1. An energy storage comprising a plurality of series connectable energy modules forming a string of energy modules, wherein each of the energy modules are connected to the string via a plurality of switches, wherein the plurality of switches are implemented in an H-bridge and located on a switch printed circuit board,
   the energy storage further comprises a string controller configured for controlling which of the energy modules that are part of a current path through the string by control of the status of a plurality of switches, and
   an energy storage monitoring system configured for monitoring at least one energy module operating parameter of the plurality of energy modules, the energy storage monitoring system comprises:
      a current sensor configured for communicating with the string controller, and
      a plurality of energy module printed circuit boards, wherein each of the energy modules are associated with one of the pluralities of energy module printed circuit board and wherein each of the plurality of energy module printed circuit boards is configured for communicating with the string controller,
   wherein the plurality of energy module printed circuit boards are configured for establishing an energy module operating parameter of the associated energy module and provide the established energy module operation parameter to the string controller,
   wherein the current sensor is configured for establishing the current in the current path through the string and provide the current to the string controller, and
   wherein the string controller is configured for bypassing an energy module based on information of status of the plurality of switches, the measured current in the current path through the string and the energy module operating parameter measured at the energy modules.

2. An energy storage according to claim 1, wherein the state of charge of the individual energy modules is established by the string controller based on information of status of the plurality of switches, the measured current in the current path through the string, energy module operating parameter and/or measurements established by sensors of the associated energy module printed circuit board.

3. An energy storage according to claim 1, wherein the state-of-health of the individual energy modules is established by the string controller based on information of status of the plurality of switches, the measured current in the current path through the string, energy module operating parameter and/or measurements established by sensors of the associated energy module printed circuit board.

4. An energy storage according to claim 1, wherein the current sensor is located in the current path upstream the first energy module of the string of energy modules or downstream the last energy module of the string of energy modules.

5. An energy storage according to claim 1, wherein the energy module printed circuit board comprises a voltage sensor.

6. An energy storage according to claim 1, wherein the energy module printed circuit board comprises information of the energy module, wherein the string controller gets access to this information when the energy module is installed in the string.

7. An energy storage according to claim 1, wherein the energy module printed circuit boards are daisy chained and wherein the first and the final energy module printed circuit board in the chain are connected to the string controller.

8. An energy storage according to claim 1, wherein the energy module printed circuit board comprises at least a temperature sensor, a voltage sensor and a memory.

9. An energy storage according to claim 1, wherein the energy module operating parameter is selected from the list comprising: current, temperature and voltage.

10. An energy storage according to claim 1, wherein each energy module comprises a plurality of energy module elements that comprise a plurality of battery elements.

11. An energy storage according to claim 1, wherein the energy storage comprises at least three strings each controlled by individual string controllers.

12. An energy storage according to claim 1, wherein the energy module printed circuit board is located at the end of an enclosure for enclosing the energy module facing a back side of an electric cabinet in which the energy module enclosure is installed.

13. An energy storage according to claim 1, wherein the electric interface of the switches of the energy module is located at the end of an enclosure for enclosing the energy module facing a back side of an electric cabinet in which the energy module enclosure is installed.

14. An energy storage according to claim 1, wherein the string controller is configured for estimating if an energy module is faulty by comparing the sum of energy module voltage received from the energy module printed circuit boards to the string voltage received from the string voltage sensor.

15. An energy storage according to claim 1, wherein the printed circuit board comprising the plurality of switches and the energy module printed circuit board are paired together communication-wise, so that the string controller knows that when switches of the printed circuit board is activated, the respective energy module and energy module printed circuit board are being used.

16. An energy storage according to claim 1, wherein the energy storage is a high power energy storage for supplying stationary loads.

17. A method of determining state of charge of at least one energy module of a plurality of series connectable energy modules;
wherein the plurality of series connectable energy modules forms a string of energy modules;
wherein each of the energy modules are connected to the string via a plurality of switches configured in an H-bridge and located on a switch printed circuit board;
wherein a string controller is configured to control which of the energy modules that are part of a current path through the string by control of the status of a plurality of switches;
wherein the method of determining state of charge is performed by the string controller according to the following steps:
from a current sensor receive a value of measured current in the current path,
select at least one of the energy modules of the string,
determine a status of the switches controlling the at least one selected energy module,
determine the polarity of the current of the at least one selected energy module, and
establish the state of charge of the at least one selected energy module by performing an integration of the current of the at least one selected energy module.

18. The method of determining state of charge of at least one energy module according to claim 17, wherein the method is implemented in an energy storage comprising:
a plurality of series connectable energy modules forming a string of energy modules, wherein each of the energy modules are connected to the string via a plurality of switches, wherein the plurality of switches are implemented in an H-bridge and located on a switch printed circuit board,
the energy storage further comprises a string controller configured for controlling which of the energy modules that are part of a current path through the string by control of the status of a plurality of switches, and
an energy storage monitoring system configured for monitoring at least one energy module operating parameter of the plurality of energy modules, the energy storage monitoring system comprises:
a current sensor configured for communicating with the string controller, and
a plurality of energy module printed circuit boards, wherein each of the energy modules are associated with one of the pluralities of energy module printed circuit board and wherein each of the plurality of energy module printed circuit boards is configured for communicating with the string controller,
wherein the plurality of energy module printed circuit boards are configured for establishing an energy module operating parameter of the associated energy module and provide the established energy module operation parameter to the string controller,
wherein the current sensor is configured for establishing the current in the current path through the string and provide the current to the string controller, and
wherein the string controller is configured for by-passing an energy module based on information of status of the plurality of switches, the measured current in the current path through the string and the energy module operating parameter measured at the energy modules.

19. The method of determining a state of charge of at least one energy module according to claim 18, wherein the state of charge is adjusted by an energy module monitoring consumption constant.

20. The method of determining a state of charge of at least one energy module according to claim 18, wherein the state of charge of a bypassed energy module is determined by integrating the energy module monitoring consumption constant.

* * * * *